(12) United States Patent
Chen et al.

(10) Patent No.: US 10,742,224 B2
(45) Date of Patent: Aug. 11, 2020

(54) VOLTAGE-FOLLOWER BASED CROSS-COUPLING OSCILLATORS WITH EMBEDDED PHASE-INTERPOLATION FUNCTION

(71) Applicant: NVIDIA Corp., Santa Clara, CA (US)

(72) Inventors: Xi Chen, Milpitas, CA (US); Sanquan Song, Mountain View, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/382,050

(22) Filed: Apr. 11, 2019

(65) Prior Publication Data

US 2020/0162082 A1 May 21, 2020

Related U.S. Application Data

(60) Provisional application No. 62/768,029, filed on Nov. 15, 2018.

(51) Int. Cl.
| | | |
|---|---|---|
| H03L 7/099 | (2006.01) | |
| H03K 3/03 | (2006.01) | |
| H03L 7/07 | (2006.01) | |
| H03K 5/133 | (2014.01) | |

(52) U.S. Cl.
CPC ........ *H03L 7/0996* (2013.01); *H03K 3/0315* (2013.01); *H03K 5/133* (2013.01); *H03L 7/07* (2013.01)

(58) Field of Classification Search
CPC ..................................................... H03L 7/0996
USPC ............................................................ 331/57
See application file for complete search history.

(56) References Cited

U.S. PATENT DOCUMENTS

| | | |
|---|---|---|
| 5,420,547 A | 5/1995 | Kikuchi |
| 5,475,344 A | 12/1995 | Maneatis et al. |
| 5,596,610 A | 1/1997 | Leung et al. |
| 5,799,051 A | 8/1998 | Leung et al. |
| 5,896,069 A | 4/1999 | Williams et al. |
| 6,297,706 B1 | 10/2001 | Pullela |
| 2005/0237122 A1 | 10/2005 | Gu |
| 2005/0248415 A1 | 11/2005 | Osvaldella |
| 2006/0244543 A1 | 11/2006 | Meltzer |
| 2007/0040621 A1* | 2/2007 | Ngo ............... H03K 3/0315 331/57 |
| 2008/0111638 A1 | 5/2008 | Thaller |
| 2017/0310277 A1 | 10/2017 | Han et al. |

* cited by examiner

*Primary Examiner* — Joseph Chang
(74) *Attorney, Agent, or Firm* — Rowan TELS LLC

(57) ABSTRACT

A circuit includes a first ring oscillator with a plurality of stages, each coupled via a voltage follower cross-coupling to a plurality of stages of a second ring oscillator. Further ring oscillators may be coupled to the first ring oscillator and the second ring oscillator. Additionally, the voltage follower cross-coupling for each of the stages may include one or more first voltage follower having a first strength, and one or more second voltage follower having a second strength different than the first strength.

15 Claims, 10 Drawing Sheets

VOLTAGE-FOLLOWER BASED CROSS-COUPLING OSCILLATORS WITH EMBEDDED PHASE-INTERPOLATION FUNCTION

CROSS-REFERENCE TO RELATED APPLICATIONS

This application claims priority and benefit under 35 U.S.C. 119(e) to U.S. application No. 62/768,029, filed on Nov. 15, 2018, the contents of which are incorporated herein by reference in their entirety.

BACKGROUND

In recent wireline communication designs, data rates higher than about 50 Gbps are becoming common even without the utilization of multi-level signaling (e.g., PAM-4). A reliable clock source may provide greater than about 25 GHz differential or greater than about 12.5 GHz quadrature timing. For low-power applications, feed-forward clocking is a promising technology, which utilizes both I and Q clock signals from the source. This requirement may effectively double the frequency target of the oscillator. For example, an about 25 Gbps system may utilize an about 25 GHz differential ring oscillator, then generate about 12.5 GHz quadrature clocks using a clock divider. In a similar link design potentially running at about 50 Gbps, the equivalent frequency of the oscillator would be at least about 50 GHz, which is impractical for a ring oscillator. An example of a ring oscillator is a device comprising an odd number of NOT gates in a ring, whose output oscillates between two voltage levels, representing true and false.

Another design challenge in high-speed clocking is the phase interpolator circuit. In feed-forward clocking systems, the phase interpolator circuit is important for performance characterization. The phase interpolator circuit is preferably continuously operational to compensate the delay mismatch between data lanes (DQs) and strobe lane (DQ-S) arising from loading mismatches at both the signal transmitter circuit and the signal receiver circuit. Phase interpolator circuits tend to be expensive in both power consumption and circuit area, especially when good resolution is required.

A conventional three-stage differential oscillator 100 utilizes inverter-based cross-coupling as shown in FIG. 1, which correlates the signal phase between opposite circuit nodes (e.g., 0 and 180 degrees). This cross-coupling works well when there is negligible signal delay between the inverters' inputs and outputs. However, in practice, the inverter delay may cause driving strength contention between the main loop circuit and coupling elements and slow down the oscillation frequency by about 30-40% as compared to single ring oscillator.

The use of inverter-based cross-coupling in conventional differential oscillators (FIG. 1) thus incurs an about 30-40% oscillation frequency reduction compared to a single three-phase ring oscillator. Normally, the benefit from inverter-based cross-coupling is better common-mode voltage definition, for example, they can be applied as differential clock sources. But a ring oscillator with an odd number of stages generally can intrinsically determine the common-mode. Thus, inverter-based cross-coupling in oscillators provides signal phase correlation but in an inefficient manner.

BRIEF SUMMARY

Techniques are disclosed utilizing tunable cross-coupling elements grouped as an assistant loop circuit in an orthogonal direction to lock the phase relationships among multiple oscillators so that the proposed circuits can be used as a clock source with fine phase tunability. The coupling loop circuit may neither be self-oscillating, nor reach the full voltage swing, but may nonetheless constrain variations.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

"Circuit stage" refers to (or stage) is a portion of a circuit having a same signal phase.

"Ring oscillator" refers to a device composed of an odd number of NOT gates in a ring, whose output oscillates between two voltage levels, representing true and false.

"Voltage follower" refers to an op-amp circuit which has a voltage gain of 1.

One challenge in the design of phase interpolator circuits is achieving high clock resolution in the later circuit stages of oscillator (e.g., clock) fan-out paths. "circuit stage" (or stage) refers to is a portion of a circuit having a same signal phase. Even if the phase interpolator circuit may be bypassed during normal operation, about half of the clock power is lost due to extra loads incurred by the use of multiplexers.

Several techniques are utilized to improve the oscillator performance (frequency, energy efficiency, etc.) and mitigate the phase interpolator circuit design challenge. Instead of pushing the single-loop ring oscillator frequency beyond the physical limit, the more realistic way is to use multiple ring oscillators with well-controlled signal phase relations among them. Previous methods like harmonic injection or multi-path oscillators all have their own problems, and usually are not reliable over a wide frequency range. The proposed technique utilizes the cross-coupling elements grouped as assistant loop circuits in an orthogonal direction and lock the phase relationships among multiple single-loop oscillators. The coupling loop circuits will neither need to be self-oscillating, nor reach the full voltage swing, but only constrains variations.

With a multi-loop oscillator (e.g., a quadrature oscillator) utilizing reliable cross-coupling there is also an opportunity to manipulate the strength of the couplings and hence the phase relationships among main oscillator loop circuits. This may effectively integrate the phase interpolator circuit into the oscillator with low cost. The phase interpolation oscillator is less expensive than conventional phase interpolator circuits for clocking high-speed links because: 1) there is no need to use duplication for matching, and 2) there is a lower fan-out (power) requirement because the phase interpolator circuit is not in the clock distribution path anymore.

Figure 1:
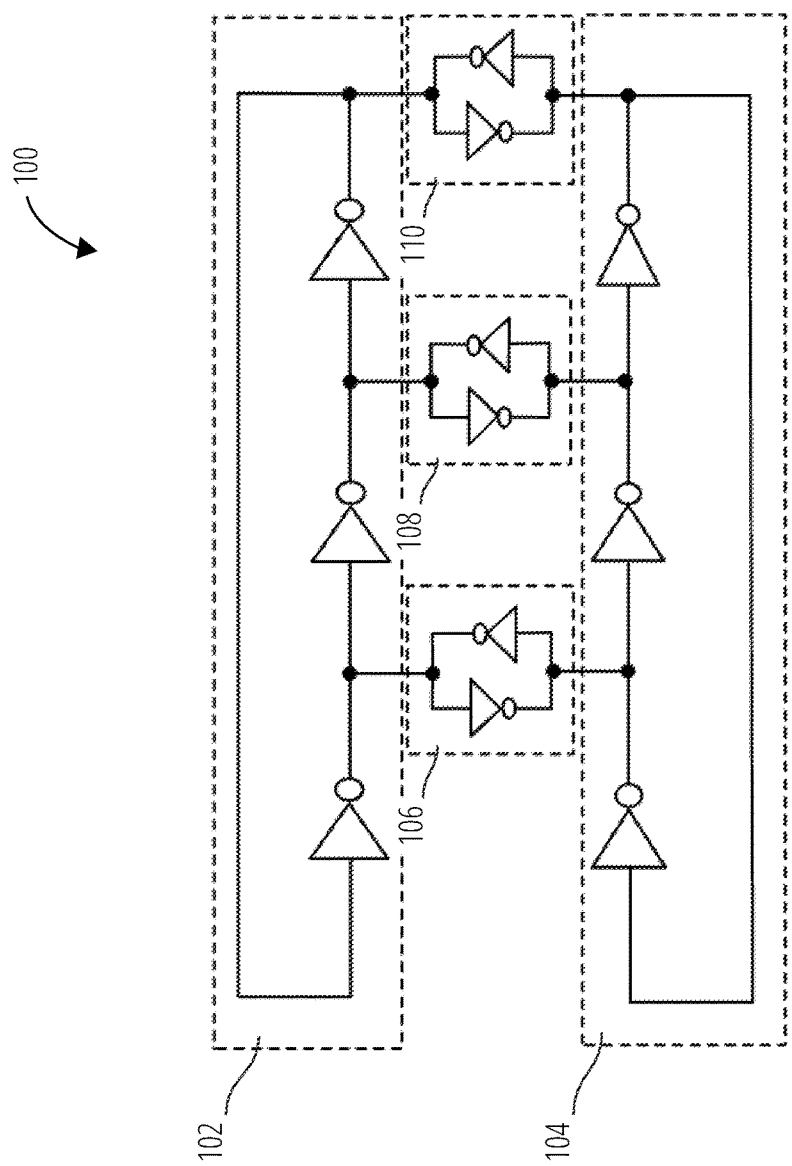
FIG. 1 illustrates a conventional three-stage differential oscillator 100 in accordance with one embodiment.

Referring to FIG. 1, a conventional three-stage differential oscillator 100 comprises a main loop circuit 102, a main loop circuit 104, a coupling element 106, a coupling element 108, and a coupling element 110. The conventional three-stage differential oscillator 100 utilizes an inverter-based cross-coupling (i.e., the coupling element 106, the coupling element 108, and the coupling element 110) between the main loop circuit 102 and the main loop circuit 104. The inverter-based cross-couplings correlate the phases between opposite nodes (e.g., 0 and 180 degrees). This type of coupling may operate efficiently when there is no delay from the input of a coupling inverter to its own output. However, inverter delay will occur and cause fighting between the main loops (the main loop circuit 102 and the main loop circuit 104) and the coupling elements (the coupling element 106, the coupling element 108, and the coupling element 110), and slow down the oscillator frequency by about 30-40% compared to a single ring oscillator.

Figure 2:
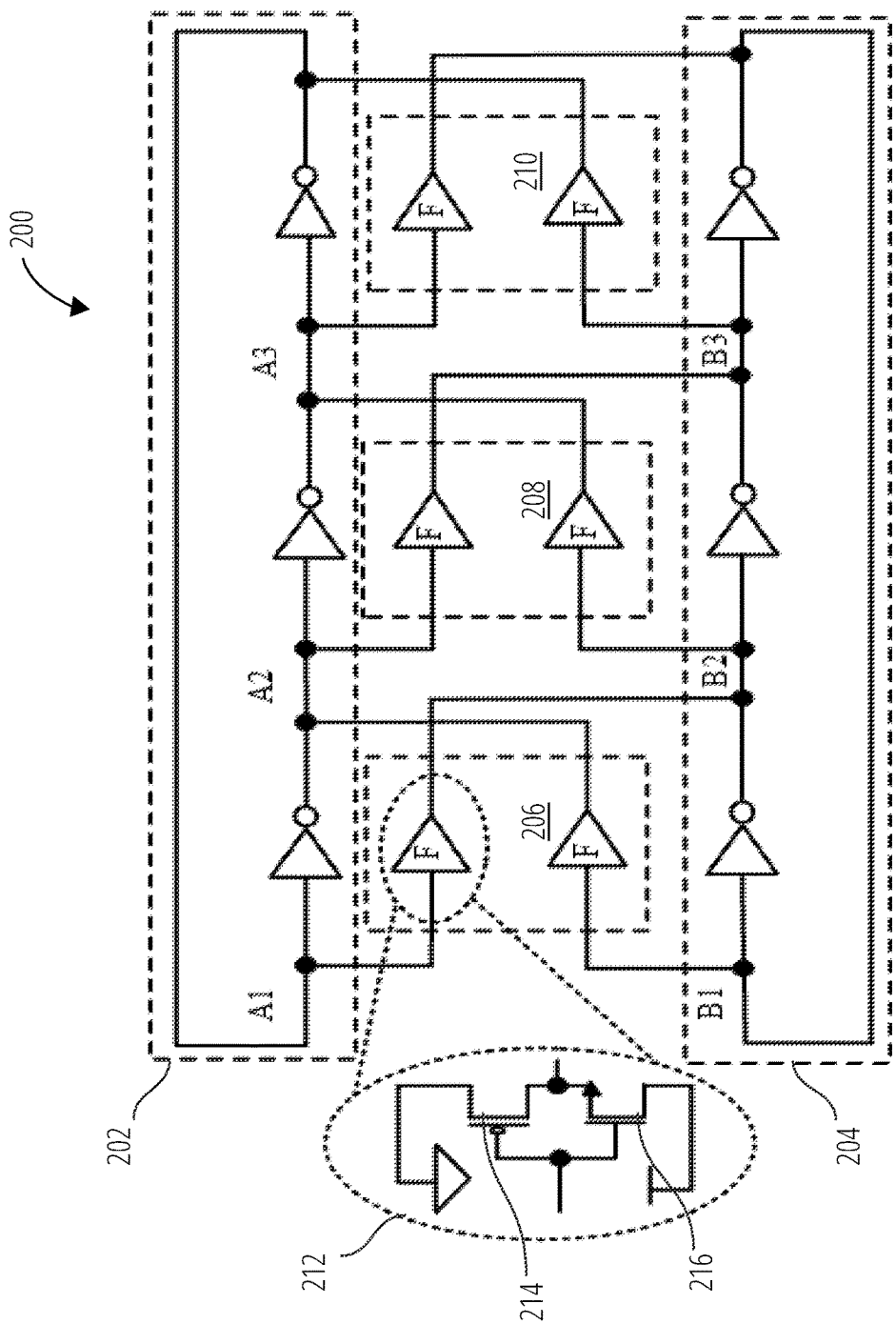
FIG. 2 illustrates a voltage follower coupling differential oscillator 200 in accordance with one embodiment.

A faster and more energy-efficient use of differential cross-coupling is illustrated in FIG. 2. A voltage follower coupling differential oscillator 200 comprises a main loop circuit 202, a main loop circuit 204, a voltage follower pair 206, a voltage follower pair 208, and a voltage follower pair 210. Each voltage follower of the voltage follower pairs comprises a voltage follower circuit 212. The voltage follower circuit 212 comprises a P-channel source-follower device 214 and an N-channel source-follower device 216. A voltage follower may for example be implemented by an op-amp circuit with a voltage gain of unity.

The main loop circuit 202 and the main loop circuit 204 are divided into circuit stages by inverters. The main loop circuit 202 may be a first ring oscillator and comprises a circuit stage with an input node A1, a circuit stage with an input node A2, and a circuit stage with an input node A3. The main loop circuit 204 may be a second ring oscillator and comprises a circuit stage with an input node B1, a circuit stage with an input node B2, and a circuit stage with an input node B3. The voltage follower pair 206, the voltage follower pair 208, and the voltage follower pair 210 couple the main loop circuit 202 to the main loop circuit 204. The voltage follower pair 206 couples A1 to B2 and A2 to B1. The voltage follower pair 208 couples A2 to B3 and A3 to B2. The voltage follower pair 210 couples A3 to B1 and A1 to B3. The cross-coupling between the main loop circuit 202 and the main loop circuit 204 thus comprises <A1:B2, B3>, <A2:B3, B1>, and <A3:B1, B2>.

This feed-forward circuit structure utilizes a coupling element that is non-inverted from input to output, and the phase difference cross each coupling phase is about 60 degrees (the intrinsic delay of one inverter in the main loop circuit). To fulfill the requirement of this feed-forward circuit, a voltage follower is used. Each voltage follower circuit 212 has two complementary (P & N) source-follower devices (i.e., the P-channel source-follower device 214 and the N-channel source-follower device 216) stacked together and provides unity voltage gain over most of the supply range. Due to the threshold limitation, the effective working range of the voltage follower circuit 212 is smaller than the full supply voltage. This is acceptable because the inverters in the main loop circuit (the main loop circuit 202 and the main loop circuit 204) pull the voltage to the power rails. Also, because the voltage follower circuit is naturally faster than an inverter of similar size (there's no "Miller Cap" in voltage follower circuit), it helps to increase the ring oscillator frequency instead of reducing it.

The feed-forward circuit may be implemented using passive components (resistors or capacitors) in the place of the voltage follower circuit 212. However, an important benefit of the voltage follower circuit 212 is that it takes output current (mostly) from the supply rails instead of the input circuit node, therefore providing an energy gain to the main loop circuit which improves the oscillation frequency.

Figure 3:
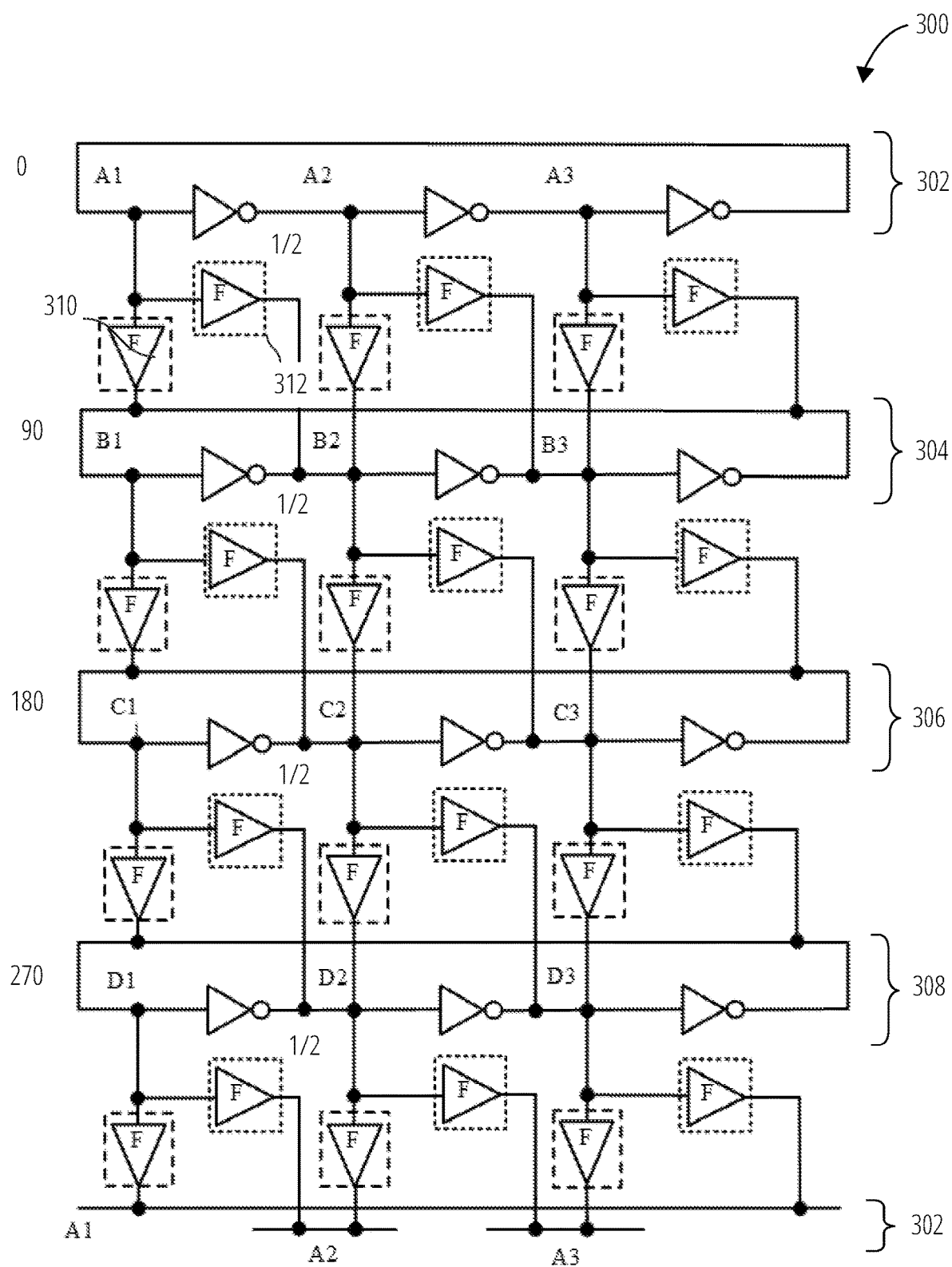
FIG. 3 illustrates a voltage follower coupling quadrature oscillator 300 in accordance with one embodiment.

An example of a voltage follower coupling quadrature oscillator 300 is shown in FIG. 3. The voltage follower coupling quadrature oscillator 300 comprises a single ring oscillator 302, a single ring oscillator 304, a single ring oscillator 306, a single ring oscillator 308, tunable feed-forward voltage followers 310, and tunable feed-back voltage followers 312.

Each single ring oscillator comprises one or more circuit stages. The single ring oscillator 302 comprises a circuit stage with an input node A1, a circuit stage with an input node A2, and a circuit stage with an input node A3. The single ring oscillator 304 comprises a circuit stage with an input node B1, a circuit stage with an input node B2, and a circuit stage with an input node B3. The single ring oscillator 306 comprises a circuit stage with an input node C1, a circuit stage with an input node C2, and a circuit stage with an input node C3. The single ring oscillator 308 comprises a circuit stage with an input node D1, a circuit stage with an input node D2, and a circuit stage with an input node D3. A total of 24 minimum-sized voltage followers are used in this circuit structure as cross-coupling devices.

The voltage followers may be separated into two groups, which are: A) the tunable feed-forward voltage followers 310 (depicted with a dashed outline and pointing down relative to FIG. 3) and B) the tunable feed-back voltage followers 312 (depicted with a dotted outline and pointing right relative to FIG. 3). The tunable feed-forward voltage followers 310 perform similar phase interpolation as is used in a differential oscillator, except that three orthogonal coupling loop circuits are used and the signal phase step across each of the tunable feed-forward voltage followers 310 is about 90 degrees. The tunable feed-forward voltage followers 310 together lock the signal phase relationships among four single ring oscillators (the single ring oscillator 302, the single ring oscillator 304, the single ring oscillator 306, and the single ring oscillator 308) as ideal quadrature, and at the meantime, increase the oscillation frequency.

The tunable feed-back voltage followers 312 illustrated in FIG. 3 may not be utilized in every embodiment, but they work with the tunable feed-forward voltage followers 310 as an array of distributive interpolators, which reduces the signal phase disturbance to a limited range and reduces the likelihood that the feed-forward coupling loop circuit may lock at the operational half-frequency. The voltage follower coupling quadrature oscillator 300 provides quadrature clock signals without the use of a clock splitting circuit. By using a following multiplexer twelve evenly distributed signal phase output signals may be generated from the quadrature oscillator, which may be useful for additional phase interpolation.

A pair of the tunable feed-forward voltage followers 310 and the tunable feed-back voltage followers 312 couple one single ring oscillator to another single ring oscillator. The single ring oscillator 302 is coupled to the single ring oscillator 304 by three pairs of the tunable feed-forward voltage followers 310 and the tunable feed-back voltage followers 312. A1 is coupled to B1 and B2. A2 is coupled to B2 and B3. A3 is coupled to B3 and B1. In some embodiments, the single ring oscillator 302 and the single ring oscillator 304 may be a first ring oscillator and a second ring oscillator, respectively. The cross-coupling between the single ring oscillator 302 and the single ring oscillator 304 thus comprises <A1:B1, B2>, <A2:B2, B3> and <A3:B3, B1>. The single ring oscillator 304 is coupled to the single ring oscillator 306 by three pairs of the tunable feed-forward voltage followers 310 and the tunable feed-back voltage followers 312. B1 is coupled to C1 and C2. B2 is coupled to C2 and C3. B3 is coupled to C3 and C1. The single ring oscillator 306 is coupled to the single ring oscillator 308 by three pairs of the tunable feed-forward voltage followers 310 and the tunable feed-back voltage followers 312. In some embodiments, the single ring oscillator 306 is a third ring oscillator, and the single ring oscillator 308 is a fourth ring oscillator. C1 is coupled to D1 and D2. C2 is coupled to D2 and D3. C3 is coupled to D3 and D1. The single ring oscillator 308 is coupled to the single ring oscillator 302 by three pairs of the tunable feed-forward voltage followers 310 and the tunable feed-back voltage followers 312. D1 is coupled to A1 and A2. D2 is coupled to A2 and A3. D3 is coupled to A3 and A1.

Although inverter-based coupling also works for the voltage follower coupling quadrature oscillator 300 (with opposite signal phase definitions in the single ring oscillator 304 and the single ring oscillator 308), the voltage follower coupling may exhibit operating speed and power-consumption advantages. Moreover, the distributive coupling structure of the voltage follower coupling quadrature oscillator 300 provides design flexibility. Because voltage followers are small circuits and have good process tracking, the voltage followers may be made tunable, and more functions may be integrated into the quadrature oscillator. The quadrature oscillator may, in some embodiments, be utilized as two groups of ring oscillator pairs while implementing the fine tuning portion of the phase interpolation using voltage follower coupling devices. The oscillator may thus directly generate the transmitter clocks and forward clocks required by feed-forward clocking links. A phase interpolation oscillator 400 and signal phase tuning polar diagram 500 for the phase interpolation oscillator 400 are illustrated in FIG. 4 and FIG. 5, respectively.

Figure 4:
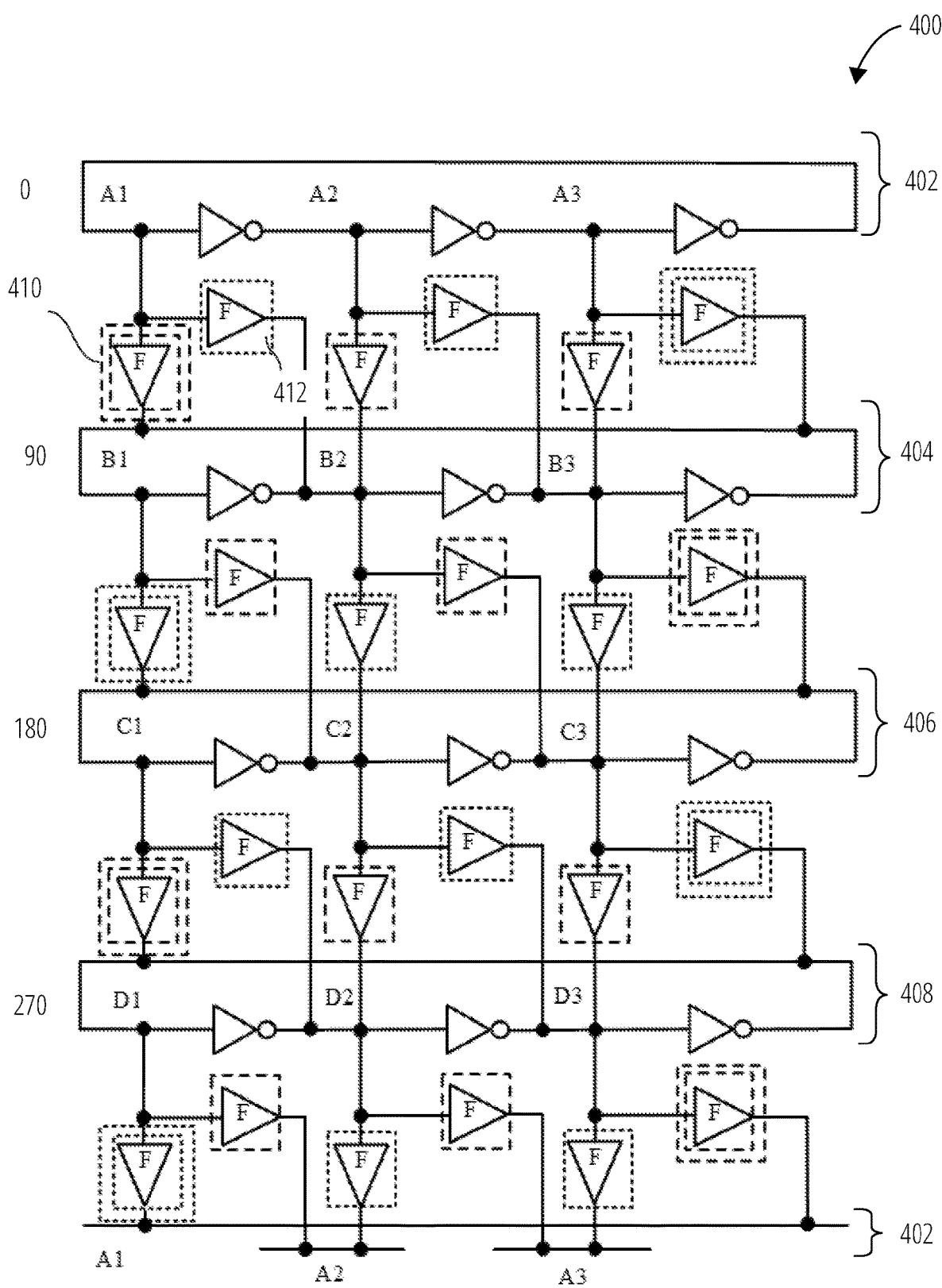
FIG. 4 illustrates a phase interpolation oscillator 400 in accordance with one embodiment.
Figure 5:
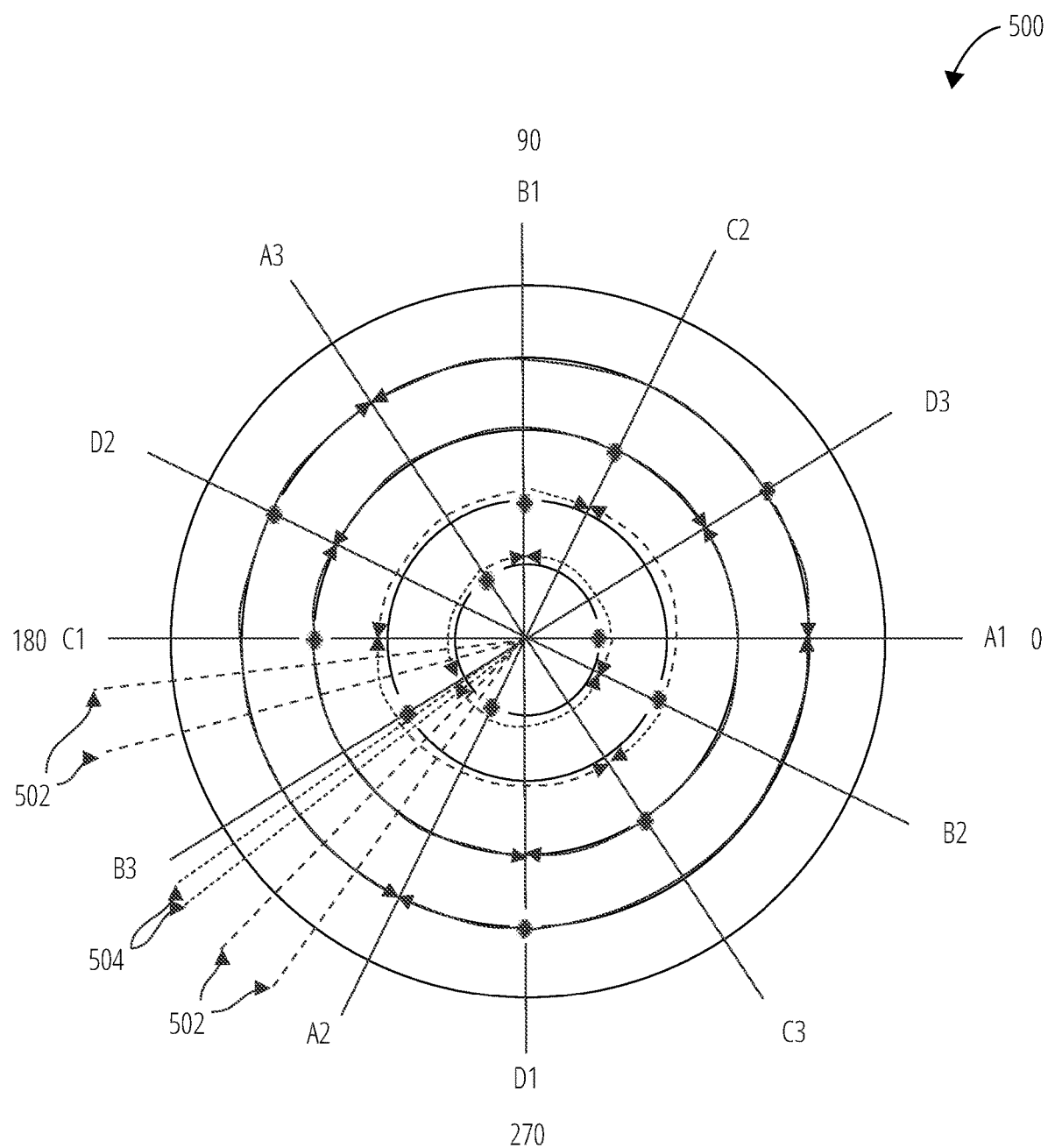
FIG. 5 illustrates a signal phase tuning polar diagram 500 for the phase interpolation oscillator 400 in accordance with one embodiment.

As shown in FIG. 4 and FIG. 5, a phase interpolation oscillator 400 comprises a ring oscillator 402, a ring oscillator 404, a ring oscillator 406, a ring oscillator 408, a voltage follower group 410, and a voltage follower group 412. The ring oscillators of the phase interpolation oscillator 400 are coupled to each other, similar to the couplings in FIG. 3. The voltage follower strength controls may be divided into two complementary groups, the voltage follower group 410 (depicted with a dashed outline in FIG. 4) and the voltage follower group 412 (depicted with a dotted outline in FIG. 4). These groups have a complementary strength relationship, such that a sum of their outputs is constant strength. By sweeping the strength ratio between the voltage followers in the voltage follower group 410 and the voltage followers in the voltage follower group 412, the signal phase may be shifted for all circuit nodes in the ring oscillator 404 and the ring oscillator 408 up and down related to circuit nodes in the ring oscillator 402 and the ring oscillator 406, preferably by about +/−30 degrees. This is referred to herein as "fine tuning" of the phase interpolation (depicted as the B3 node fine tuning 502). In some embodiments, the voltage follower group 410 may comprise one or more first voltage follower having a first strength, and the voltage follower group 412 may comprise one or more second voltage follower having a second strength different than the first strength.

The twelve internal nodes of the phase interpolation oscillator 400 may be divided into two groups (depicted as angular lines in the signal phase tuning polar diagram 500), and coarse tuning of the phase interpolation may then be implemented as two six-to-two multiplexers in a circuit stage following the oscillator, for both data transmitter clocks and forward clocks. If more signal phases are needed (as for example in a 4-to-1 signal transmitter circuit), dividers may be utilized to generate quadrature clocks for data paths and feed-forward clock path separately. In FIG. 5, each circuit stage is depicted as a radial line. A coupling between two circuit stages is depicted as an arrow. The dotted and dashed arrows represent altering the voltage follower strength controls to generate the fine tuning 502. In the signal phase tuning polar diagram 500, the effect on the signal phase of the circuit node B3 is depicted. The signal phase of B1, B2, D1, D2, and D3 may similarly be affected by altering the voltage follower strength controls.

Implementing the fine tuning circuit stage before the coarse tuning circuit stage is a major difference compared to conventional phase interpolator circuit designs, which reduces the effort of duplicating the expensive phase-blender (plus multiplexer, pause, delay-trim, etc.) for each signal phase in the clock distribution (e.g., 4× for 2-to-1 signal transmitter circuit, 8× for 4-to-1 signal transmitter circuit), basically only for delay matching. Moving the fine-tune part of phase interpolation into the oscillator, the early circuit stage of clock signal distribution, solves the conflict of clock fan-out and signal phase interpolation resolution. The phase interpolator circuit in the oscillator may not be required to drive the loadings by itself.

The driving strength of voltage follower coupling may be limited by random variations. The smaller and distributive phase interpolator circuit structure saves area, power, and reduces variations statistically. To further extend the signal phase tuning resolution, a "fractional tuning" control may be utilized (depicted as the fractional tuning 504), a feature of the distributive phase interpolator circuit. For integer fine tuning, all voltage followers with the same signal phase control part (depicted as having the same outline, dotted or dashed, in FIG. 4) are set to identical values. However, it may be convenient to assign the controls bits (or part of the bits) for each voltage follower circuit column of the phase interpolation oscillator 400 separately. If one of the three voltage follower columns in the phase interpolation oscillator 400 is set with +/−1 least significant bit (LSB) offset compared to other two columns (e.g., the doubly outlined voltage follower devices in FIG. 4), this creates a +/−⅓ fine tuning, or in other words, the fractional tuning 504. In the signal phase tuning polar diagram 500, the fractional tuning 504 is depicted for the circuit node B3.

In the embodiment of FIG. 5, each fine tune step is 10 degrees (60 degrees divided by 6) but this step can be more or less than this by design. Each fractional tune step in FIG.

5 is 3.3 degrees (10 degrees divided by 3). In another embodiment four fine tune steps are utilized each with three fractional tune steps.

In one embodiment, fine tuning plus fractional tuning provides 18 steps out of an about 60 degree range, with linearity. The total tuning steps out of one oscillation cycle may be 6×6×3=108, which is higher than conventional designs (60 steps in two oscillator cycles). The 6×6×3 phase interpolation oscillator may operate at about 28 GHz and about 714 mV. The two groups of clock signals generated by the phase interpolation oscillator may be used as either full speed differential clocks for 2-to-1 signal transmitter circuit or half-speed quadrature-clocks (after dividers) for 4-to-1 signal transmitter circuit.

In the phase interpolation oscillator 400 of FIG. 4 the signal phase gaps from the feed-forward voltage followers (depicted as pointing down relative to FIG. 4) and the feed-back voltage followers (depicted as pointing right relative to FIG. 4) are different in each local phase interpolation pair. This is because the phase step for all the feed-forward voltage followers is extended to about 90 degrees each, and the coupling loop circuits are closed with four voltage follower circuit stages. The extended feed-forward improves the frequency performance and provides voltage margin to avoid threshold limitations. The three feed-forward loop circuits help ensure the linearity of the signal phase tuning, even though the static ratio of local phase interpolator circuit pair (one feed-forward circuit vs. one feed-back circuit for each circuit node) may not be exactly balanced. The effective factor of a local phase interpolator circuit pair is the delta value added/subtracted.

In a simplified version of the phase interpolation oscillator 400, the strength of the feed-back voltage followers may be fixed at some minimum level with tuning applied only to the feed-forward voltage followers, with similar linearity achieved.

Figure 6:
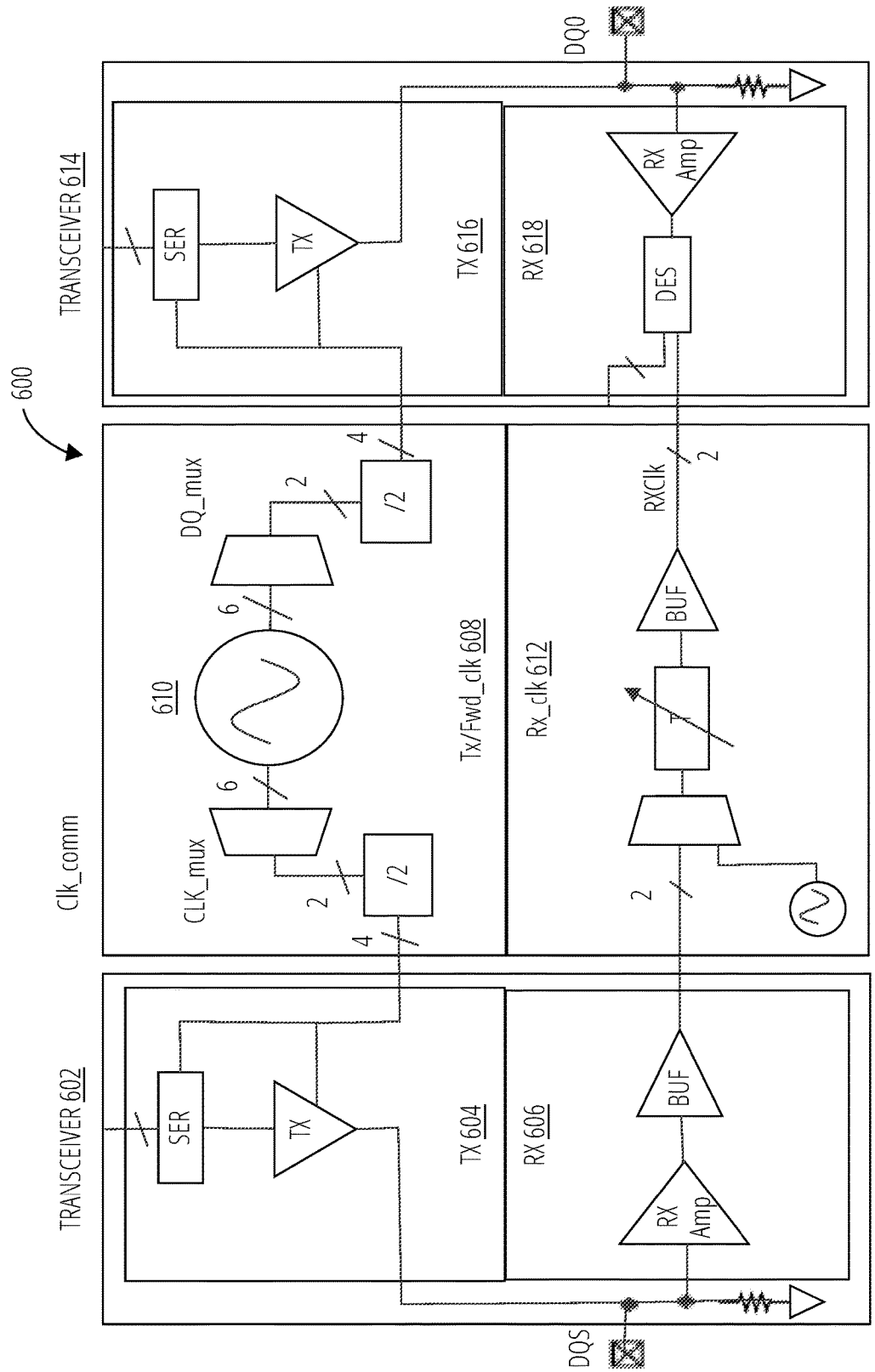
FIG. 6 illustrates a transceiver utilizing a phase interpolation oscillator 600 in accordance with one embodiment.

FIG. 6 illustrates a transceiver utilizing a phase interpolation oscillator 600 as the clock source for high-speed (e.g., about 50 Gbps) quadrature mode transceiver. The transceiver utilizing a phase interpolation oscillator 600 comprises a clock lane (or strobe lane) transceiver 602 (including a transmitter 604 and a receiver 606), a transmit/forward clock generator 608 (with a phase interpolation oscillator 610), a receiver clock buffer 612, and one or more data lane (or DQ lane) transceiver 614 (including a transmitter 616 and a receiver 618). For more traditional transceivers using differential full-rate clocks, the divider stages can be skipped. To generate the phase-tuning quadrature clocks based on conventional approaches using (oscillator->divider->phase interpolator circuit), the area and power overhead of the phase interpolator circuit and associated logic may be significantly higher. The phase interpolation oscillator 610 may be the voltage follower coupling quadrature oscillator 300 (if only coarse tune needed), the phase interpolation oscillator 400, the quadrature oscillator 700, depicted in the FIG. 3, FIG. 4, or FIG. 7, respectively.

Figure 7:
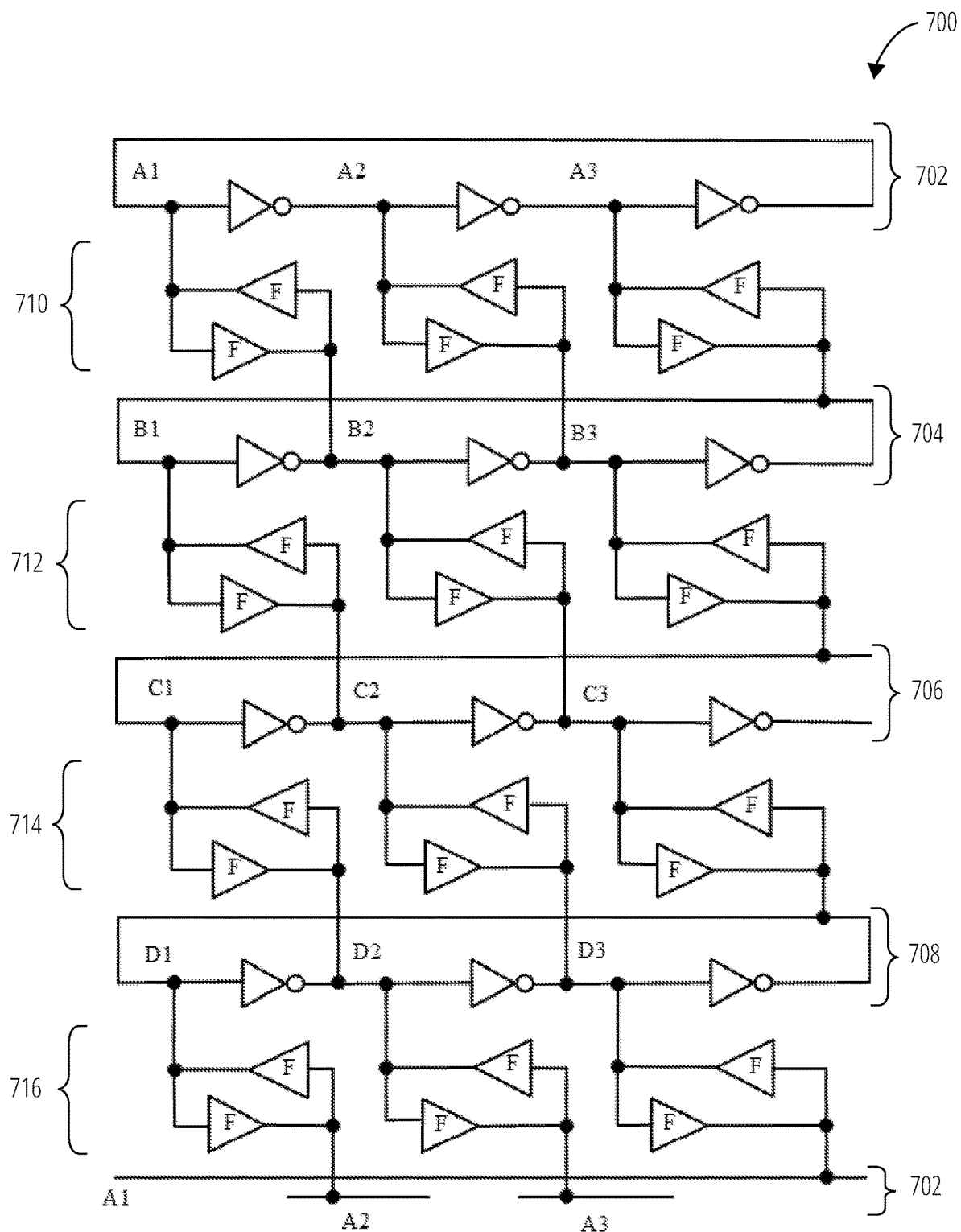
FIG. 7 illustrates a quadrature oscillator 700 in accordance with an alternate embodiment.

FIG. 7 illustrates an alternate embodiment of a quadrature oscillator 700 that interpolates from two immediate neighboring signal phases (+/−about 30 degrees). The quadrature oscillator 700 comprises a ring oscillator 702, a ring oscillator 704, a ring oscillator 706, a ring oscillator 708, voltage follower couplings 710, voltage follower couplings 712, voltage follower couplings 714, and voltage follower couplings 716.

The ring oscillator 702 comprises a circuit stage with an input node A1, a circuit stage with an input node A2, and a circuit stage with an input node A3. The ring oscillator 704 comprises a circuit stage with an input node B1, a circuit stage with an input node B2, and a circuit stage with an input node B3. The ring oscillator 706 comprises a circuit stage with an input node C1, a circuit stage with an input node C2, and a circuit stage with an input node C3. The ring oscillator 708 comprises a circuit stage with an input node D1, a circuit stage with an input node D2, and a circuit stage with an input node D3. The voltage follower couplings 710 couple A1 to B2, A2 to B3, and A3 to B1. The voltage follower couplings 712 couple B1 to C2, B2 to C3, and B3 to C1. The voltage follower couplings 714 couple C1 to D2, C2 to D3, and C3 to D1. The voltage follower couplings 716 couple D1 to A2, D2 to A3, and D3 to A1. Each voltage follower coupling comprises two voltage follower devices. Each of the circuit stages of a first ring oscillator is thus coupled via a voltage follower cross-coupling to a corresponding adjacent stage of a second ring oscillator. For example, a voltage follower cross-coupling may comprise <A1:B2>, <A2:B3> and <A3:B1>. In a further embodiment with a third ring oscillator, each of the stages of the second ring oscillator may be coupled via a voltage follower cross-coupling to a corresponding adjacent stage of the third ring oscillator. For example, a voltage follower cross-coupling may comprise <B1:C2>, <B2:C3> and <B3:C1>.

Figure 8:
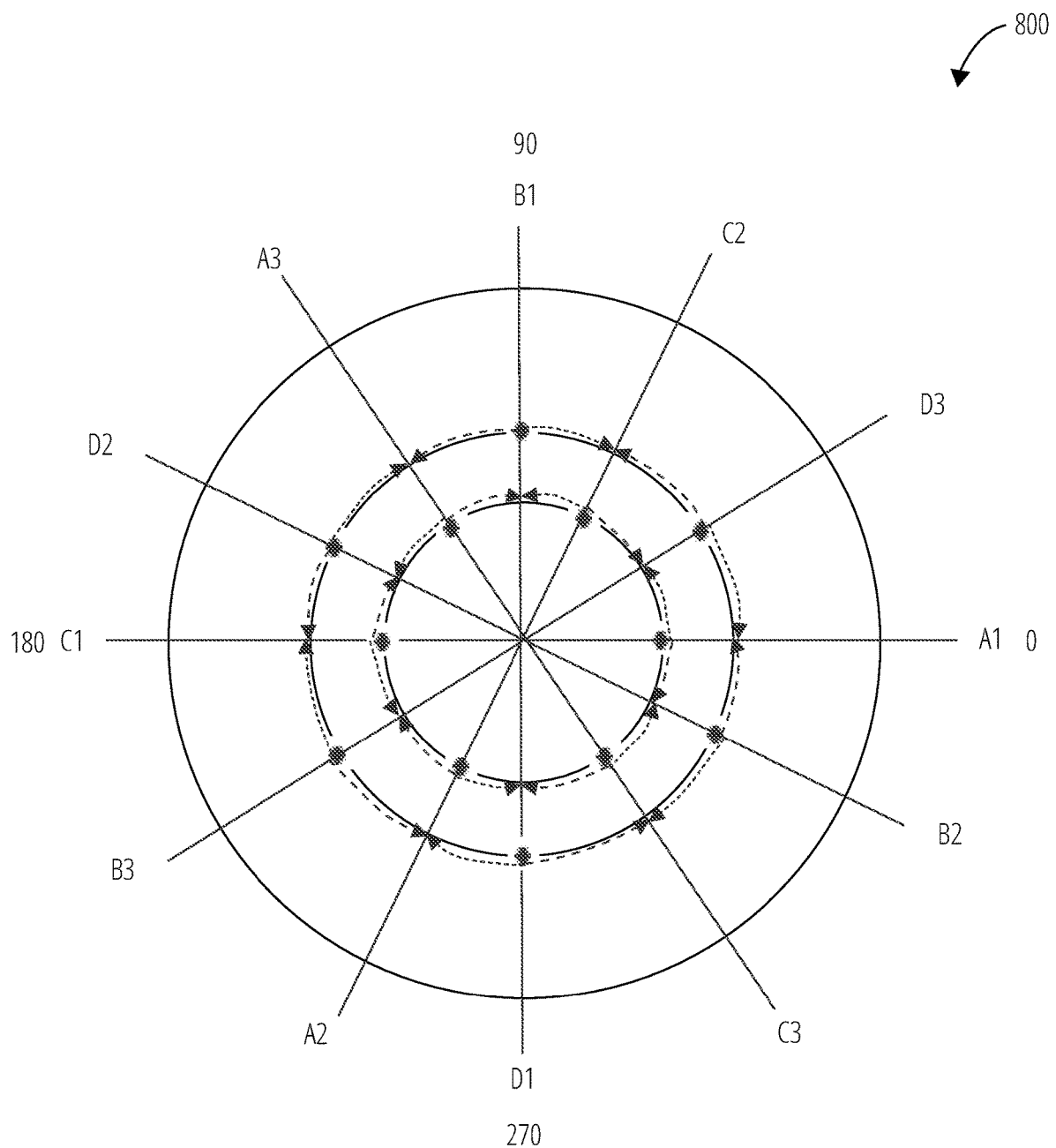
FIG. 8 illustrates a polar signal phase diagram 800 for the quadrature oscillator 700 in accordance with one embodiment.

The quadrature oscillator 700 is more robust over variations and may be more linear than the phase interpolation oscillator 400 with signal phase tuning, if the threshold voltage constraint is acceptable. However, with voltage follower couplings, the signal phase tuning of the quadrature oscillator 700 may not reach the full range due to the threshold voltage constraint. However, the quadrature oscillator 700 may be well suited for implementations in which no (or little) phase interpolation is required in the quadrature oscillator. Alternatively, tunable inverter-based couplings may be utilized to solve the signal phase tuning range limitation at the cost of lower speed. A polar signal phase diagram 800 for the quadrature oscillator 700 is illustrated in FIG. 8. The signal phases for the voltage follower couplings 710 and the voltage follower couplings 714 are depicted by dashed arrows in FIG. 8. The signal phases for the voltage follower couplings 712 and the voltage follower couplings 716 are depicted as dotted arrows in FIG. 8. The circuit stages are depicted as radial lines in FIG. 8.

Figure 9:
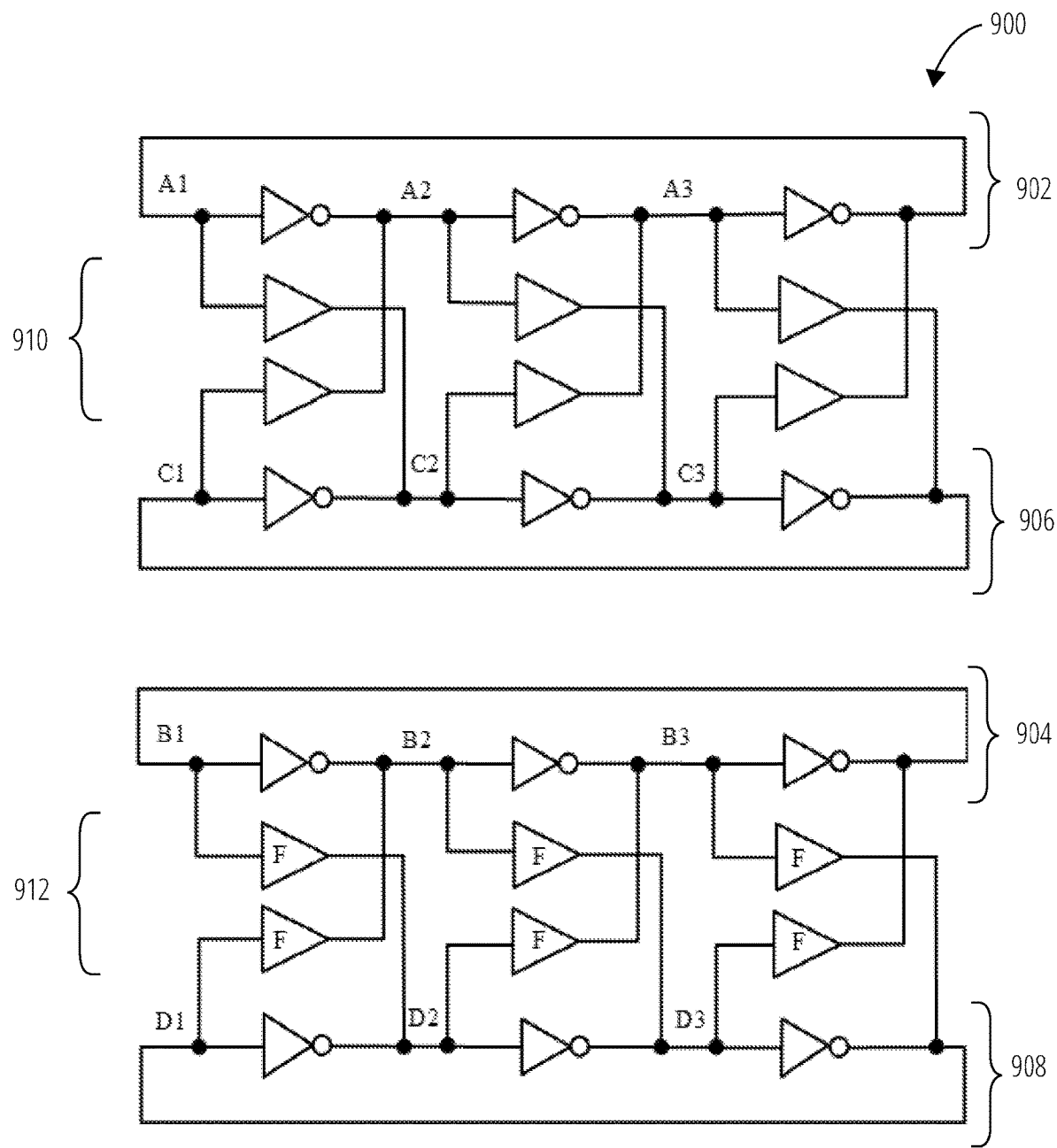
FIG. 9 illustrates differential couplings for a quadrature oscillator 900 in accordance with one embodiment.
Figure 10:
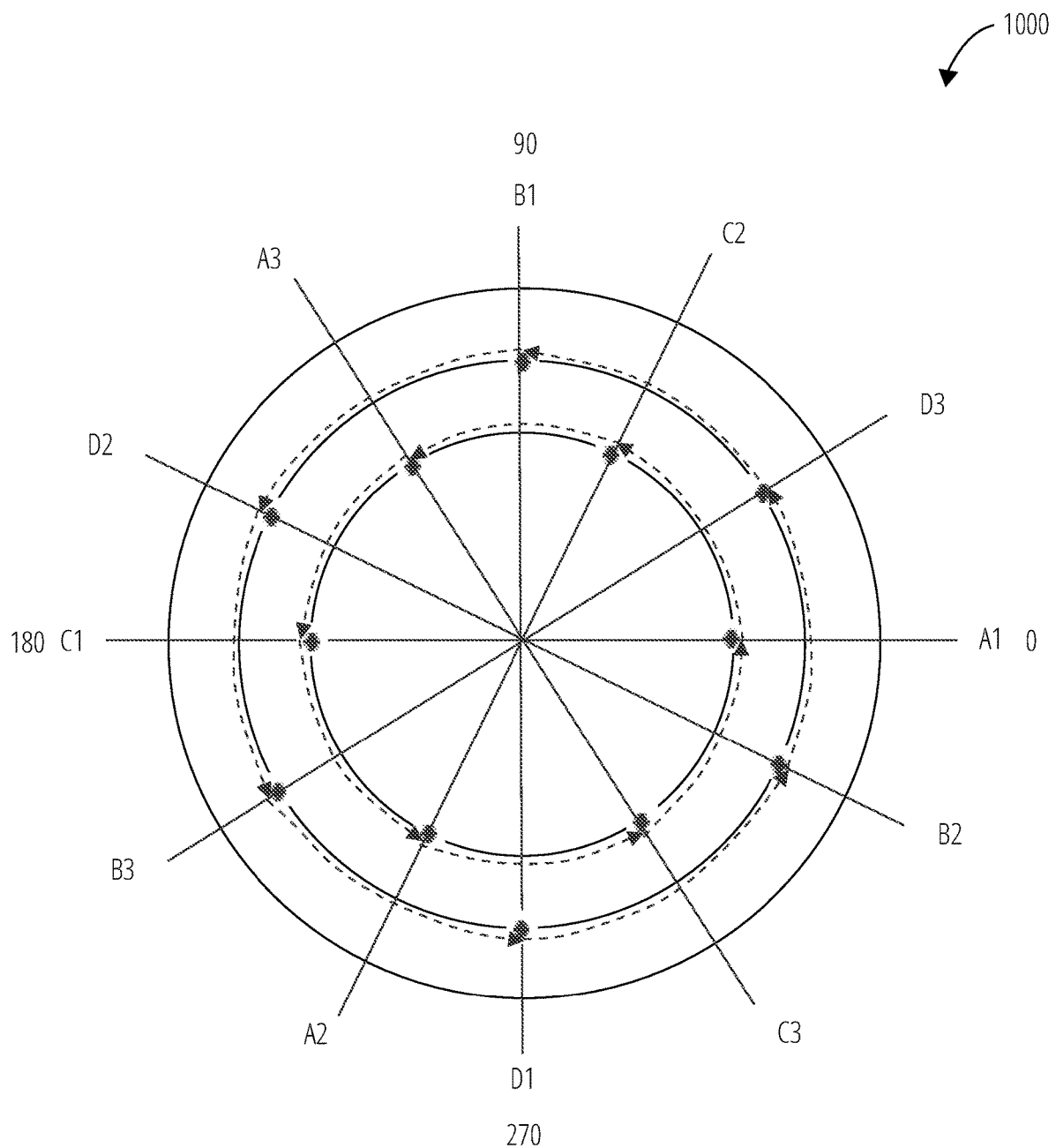
FIG. 10 illustrates a polar signal phase diagram 1000 for the differential couplings for a quadrature oscillator 900 in accordance with one embodiment.

FIG. 9 illustrates differential couplings for a quadrature oscillator 900 in one embodiment, and FIG. 10 illustrates a corresponding polar signal phase diagram 1000. The differential couplings for a quadrature oscillator 900 comprises a ring oscillator 902, a ring oscillator 906, a ring oscillator 904, a ring oscillator 908, differential couplings 910, and differential couplings 912.

The ring oscillator 902 comprises a circuit stage with an input node A1, a circuit stage with an input node A2, and a circuit stage with an input node A3. The ring oscillator 906 comprises a circuit stage with an input node C1, a circuit stage with an input node C2, and a circuit stage with an input node C3. The ring oscillator 904 comprises a circuit stage with an input node B1, a circuit stage with an input node B2, and a circuit stage with an input node B3. The ring oscillator 908 comprises a circuit stage with an input node D1, a circuit stage with an input node D2, and a circuit stage with an input node D3. The differential couplings 910 couple the ring oscillator 902 to the ring oscillator 906. Specifically, A1 is coupled to C2 and C3, A2 is coupled to C1 and C3, and A3 is coupled to C1 and C2. The differential couplings 912 couple the ring oscillator 904 to the ring oscillator 908. Specifically, B1 is coupled to D2 and D3, B2 is coupled to D1 and D3, and B3 is coupled to D1 and D2.

Adding differential couplings (the differential couplings 910 and the differential couplings 912) may lock the signal phase relationships within differential pairs. The differential couplings 910 may lock the signal phase relationship of the ring oscillator 902 and the ring oscillator 906 (loop circuit A and loop circuit C, respectively). The differential couplings 912 may lock the signal phase relationship of the ring oscillator 904 and the ring oscillator 908 (loop circuit B and loop circuit D, respectively). Adding differential couplings may inhibit locking the loop circuits at half-frequency. Half-frequency locking occurs when the quadrature coupling loop circuit operates at an effective two-oscillator-cycles period instead of one. This may turn one quadrature oscillator into two overlapping differential oscillators. Although this condition is unlikely to happen in normal operation, it may occasionally occur up in abnormal supply voltage ramp-up situations. Adding additional differential couplings helps to exclude the possibility of the differential couplings for a quadrature oscillator (such as voltage follower coupling quadrature oscillator 300, phase interpolation oscillator 400, or quadrature oscillator 700) entering a half-frequency mode, even with minimally-sized voltage follower components. Moreover, because the strength from differential couplings is single directional (depicted as dashed arrows in FIG. 10), the extra power utilized by differential couplings may improve the oscillator speed.

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

"Logic" is used herein to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A circuit comprising:
    a first ring oscillator comprising a plurality of stages; and
    each output of the stages of the first ring oscillator coupled via a voltage follower cross-coupling to a plurality of stages of a second ring oscillator.

2. The circuit of claim 1, wherein the plurality of stages of the first ring oscillator comprise A1, A2, and A3, and the plurality of stages of the second ring oscillator comprise B1, B2, and B3, and cross-coupling between the first ring oscillator and the second ring oscillator comprises <A1:B2, B3>, <A2:B3, B1> and <A3:B1, B2>.

3. The circuit of claim 1, wherein the plurality of stages of the first ring oscillator comprise A1, A2, and A3, and the plurality of stages of the second ring oscillator comprise B1, B2, and B3, and cross-coupling between the first ring oscillator and the second ring oscillator comprises <A1:B1, B2>, <A2:B2, B3> and <A3:B3, B1>.

4. The circuit of claim 1, wherein the voltage follower cross-coupling for each of the stages comprises one or more first voltage follower having a first strength, and one or more second voltage follower having a second strength different than the first strength.

5. The circuit of claim 1, further comprising:
a third ring oscillator comprising a plurality of stages; and
each of the stages of the third ring oscillator coupled via a voltage follower cross-coupling to a plurality of stages of a fourth ring oscillator.

6. A circuit comprising:
a first ring oscillator comprising a plurality of stages; and
each output of the stages of the first ring oscillator coupled via a voltage follower cross-coupling to a corresponding adjacent stage of a second ring oscillator.

7. The circuit of claim 6, wherein the plurality of stages of the first ring oscillator comprise A1, A2, and A3, and the plurality of stages of the second ring oscillator comprise B1, B2, and B3, and cross-coupling between the first ring oscillator and the second ring oscillator comprises <A1:B2>, <A2:B3> and <A3:B1>.

8. The circuit of claim 6, further comprising:
a third ring oscillator comprising a plurality of stages; and
each of the stages of the second ring oscillator coupled via a voltage follower cross-coupling to a corresponding adjacent stage of the third ring oscillator.

9. The circuit of claim 8, wherein the plurality of stages of the first ring oscillator comprise B1, B2, and B3, and the plurality of stages of the second ring oscillator comprise C1, C2, and C3, and cross-coupling between the first ring oscillator and the second ring oscillator comprises <B1:C2>, <B2:C3> and <B3:C1>.

10. The circuit of claim 8, wherein each voltage follower cross-coupling of each stage of the first ring oscillator to a corresponding adjacent stage of a second ring oscillator has a first strength, and each voltage follower cross-coupling of each stage of the second ring oscillator to a corresponding adjacent stage of the third ring oscillator has a second strength.

11. A circuit comprising:
a plurality of multi-stage ring oscillators; and
a plurality of voltage follower cross-couplings between outputs of different stages of different ones of the ring oscillators.

12. The circuit of claim 11, wherein stages of a first ring oscillator of the ring oscillators comprise A1, A2, and A3, and stages of a second ring oscillator of the ring oscillators comprise B1, B2, and B3, and the voltage follower cross-couplings between the first ring oscillator and the second ring oscillator comprise <A1:B2, B3>, <A2:B3, B1> and <A3:B1, B2>.

13. The circuit of claim 11, wherein stages of a first ring oscillator of the ring oscillators comprise A1, A2, and A3, and stages of a second ring oscillator of the ring oscillators comprise B1, B2, and B3, and voltage follower cross-couplings between the first ring oscillator and the second ring oscillator comprise <A1:B1, B2>, <A2:B2, B3> and <A3:B3, B1>.

14. The circuit of claim 11, wherein the voltage follower cross-couplings comprise one or more first voltage follower having a first strength, and one or more second voltage follower having a second strength different than the first strength.

15. The circuit of claim 11, wherein the ring oscillators comprise a quadrature oscillator wherein each of the stages of each ring oscillator are coupled via a voltage follower cross-coupling to a plurality of stages of a different ring oscillator.

* * * * *